United States Patent
Kishida et al.

(10) Patent No.: US 6,400,022 B1
(45) Date of Patent: Jun. 4, 2002

(54) SEMICONDUCTOR DEVICE AND FABRICATION PROCESS THEREFOR AND CAPACITOR STRUCTURE

(75) Inventors: Takeshi Kishida; Shigenori Kido, both of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/907,689

(22) Filed: Jul. 19, 2001

(30) Foreign Application Priority Data

Jan. 18, 2001 (JP) .......................... 2001-009919

(51) Int. Cl.[7] .............................................. H01L 28/40
(52) U.S. Cl. ........................................ 257/750; 438/393
(58) Field of Search ........................ 257/306, 311, 257/750, 751, 774, 775, 303, 381, 385, 756; 438/393

(56) References Cited

U.S. PATENT DOCUMENTS 5,895,975 A * 4/1999 Lin ............................. 257/758
6,072,237 A * 6/2000 Jang et al. .................. 257/698
6,249,054 B1 * 6/2001 Tanigawa .................... 257/385
6,291,883 B1 * 9/2001 Nagy et al. ................. 257/734

FOREIGN PATENT DOCUMENTS

JP    4-307965    10/1992

* cited by examiner

*Primary Examiner*—David Nelms
*Assistant Examiner*—David Vu
(74) *Attorney, Agent, or Firm*—McDermott, Will & Emery

(57) ABSTRACT

A semiconductor device with a high reliability is provided. The semiconductor device includes a silicon substrate, titanium nitride films and an interlayer insulating film. A first opening is formed in the titanium nitride film. A second opening having a diameter different from that of the first opening is formed in the second titanium nitride film. A contact hole is formed in the interlayer insulating film. A titanium film, a titanium nitride film, a plug layer and an interconnect layer are formed so as to be electrically connected to the titanium nitride films through the first and second openings.

10 Claims, 8 Drawing Sheets

SEMICONDUCTOR DEVICE AND FABRICATION PROCESS THEREFOR AND CAPACITOR STRUCTURE

BACKGROUND OF THE INVENTION

1. Field of the Invention

The present invention relates to a semiconductor device and a fabrication process therefor, and a capacitor structure and particularly, to a semiconductor device with a capacitor and a fabrication process therefor.

2. Description of the Background Art

A dynamic random access memory (DRAM) has been known, as a memory on which random input/output of storage information can be performed among semiconductor devices. FIG. 16 is a sectional view of a prior art DRAM. Referring to FIG. 16, the prior art DRAM includes a field effect transistor 9 and a capacitor 25 connected to the field effect transistor 9.

The field effect transistor 9 is constructed of a gate electrode 5 formed on a silicon substrate 1 with a gate oxide film 4 interposing therebetween and a region 3 including a source and a drain formed on the silicon substrate 1 on respective both sides of the gate electrode 5. Trenches 1a are formed in the vicinity of the field effect transistor 9 and a silicon oxide film 2 as a isolation insulating film is formed so as to fill the trenches 1a.

An interlayer insulating film 10 made of a silicon oxide film is formed on a surface of the silicon substrate 1. A contact hole 11 extending to the source/drain region 3 is formed in the interlayer insulating film 10 and a plug layer 12 fills the contact hole 11.

The capacitor 25 is formed so as to be electrically connected to the field effect transistor 9 through the plug layer 12. The capacitor 25 is constructed of a storage node 13, a dielectric film 14 provided on the storage node 13 and a cell plate 17 provided on the dielectric film 14. An interlayer insulating film 20 is provided on the interlayer insulating film 10 so as to cover the cell plate 17 and the dielectric film 14.

A contact hole 20h is formed in the interlayer insulating film 20 and communicates with an opening 17h formed in the cell plate 17. A titanium film 21 and a titanium nitride film 22 are formed on sidewalls of the contact hole 20h and the opening 17h in contact with the sidewalls and further, a plug layer 23 made of tungsten is provided so as to be in contact with the titanium nitride film 22. An interconnect layer 24 is provided so as to be in contact with the plug layer 23. The interconnect layer 24 is electrically connected to the cell plate 17 through the plug layer 23, the titanium nitride film 22 and the titanium film 21 formed in the opening 17h.

Description will be given of problems encountered in a prior art semiconductor device below:

In recent years, miniaturization of DRAM has progressed such that, for example, a gate length of the gate electrode 5 is 0.15 $\mu$m or less and a diameter of the contact hole 20h is 0.24 $\mu$m or less. With as small a diameter of the contact hole 20h as this, a diameter of the opening 17h becomes small as well, leading to a problem that a contact area between the cell plate 17 and the titanium film 21 becomes smaller and thereby electric resistance of a contact therebetween increases. When a contact resistance between the cell plate 17 and the titanium film 21 of DRAM is larger, difficulty arises in keeping a potential of the cell plate 17 at a prescribed level, again resulting in a problem of reduced reliability of a semiconductor device.

SUMMARY OF THE INVENTION

The present invention has been made in order to solve problems as described above and it is accordingly an object of the present invention to provide a high reliability semiconductor device and a high reliability capacitor structure.

A semiconductor device according to the present invention includes: a semiconductor substrate; a first conductive layer formed on the semiconductor substrate; a second conductive layer on the first conductive layer in contact therewith; and an insulating layer covering the second conductive layer. A first opening is formed in the first conductive layer. A second opening communicating with the first opening and having a diameter different from that of the first opening is formed in the second conductive layer. A connection hole communicating with the second opening is formed in the insulating layer. The semiconductor device further includes: a third conductive layer formed on the insulating layer so as to be electrically connected to the first and second conductive layers through the first and second openings.

In the semiconductor device having such a structure, a step arises between the first and second openings because of a difference in diameter between the first and second openings. Alternatively, a tapered portion arises therebetween. Since the third conductive layer is electrically connected to the first and second conductive layers through the first and second openings, combined contact areas of the third conductive layer with the first and second conductive layers increase. As a result, a contact resistance therebetween decreases, thereby enabling enhanced reliability of a semiconductor device.

It is preferable that a diameter of the second opening is larger than that of the first opening. In this case, the first and second openings are of a combined shape tapered in the depth direction and as a result, the third conductive layer fills the first and second openings with ease.

It is preferable that the first opening has a bottom surface. In this case, the first and third conductive layers are in contact with each other; therefore, more of a contact area is ensured. As a result, a contact resistance can be further reduced.

It is preferable that the third conductive layer includes a plug layer filling a connection hole and electrically connected to the first and second conductive layers.

It is preferable that the first and second conductive layers are made of respective materials different from each other.

It is preferable that the first and second conductive layers are formed by means of respective methods different from each other.

It is preferable that the first conductive layer is a titanium nitride film formed by means of a chemical vapor deposition method and the second conductive layer is a titanium nitride formed by means of a sputtering method.

It is preferable that the first and second conductive layers each include first and second elements and a ratio of the first element to the second element in the first conductive layer is different from a ratio of the first element to the second element in the second conductive layer.

It is preferable that the first conductive layer constitutes a cell plate of a capacitor of a dynamic random access memory.

A capacitor structure according to the present invention includes: a first capacitor electrode; a dielectric film formed on the first capacitor electrode; and a second capacitor electrode formed on the dielectric film. The second capacitor electrode includes: a first conductive layer; and a second conductive layer on the first conductive layer in contact therewith. The capacitor structure further includes: an insulating layer covering the second conductive layer. A first opening is formed in the first conductive layer. A second opening communicating with the first opening and having a diameter different from that of the first opening is formed in the second conductive layer. A connection hole communicating with the second opening is formed in the insulating layer. Furthermore, the capacitor structure includes: a third conductive layer formed on the insulating layer so as to be electrically connected to the first and second conductive layers through the first and second openings.

In the capacitor structure constructed in such a way, the first and second openings are different in diameter from each other. Therefore, a step arises between the first and second openings. Alternatively, a tapered portion arises therebetween. Therefore, combined areas of the third conductive layer with the first and second openings increase and contact areas combined contact areas of the third conductive layer with the first and second conductive layers increase. As a result, a contact resistance therebetween can be reduced, thereby enabling enhanced reliability of a capacitor structure.

A fabrication process for a semiconductor device according to the present invention includes the following steps:

(1) a step of forming a first conductive layer on a semiconductor substrate;

(2) a step of forming a second conductive layer on the first conductive layer in contact therewith;

(3) a step of forming an insulating layer on the second conductive layer;

(4) a step of forming a mask layer having a hole on the insulating layer;

(5) a step of etching the insulating layer and the second and first conductive layers with the mask layer as a mask to form a connection hole in the insulating layer, form a second opening having a relatively larger diameter and communicating with the connection hole in the second conductive layer and form a first opening having a relatively smaller diameter and communicating with the second opening in the first conductive layer; and (6) a step of forming a third conductive layer so as to be electrically connected to the first and second conductive layers through the first and second openings.

According to a fabrication process for a semiconductor device including such steps, there are formed the second opening having a relatively larger diameter and the first opening having a relatively smaller diameter; therefore, a step arises between the first and second openings. Alternatively, a tapered portion arises therebetween. The third conductive layer is formed so as to be electrically connected to the first and second conductive layers through the first and second openings. Therefore, combined contact areas of the third conductive layer with the first and second conductive layers increase and thereby, a contact resistance therebetween can be reduced. As a result, a high reliability semiconductor device can be provided.

It is preferable that the etching step includes to etch the first and second conductive layers in a condition that an etching rate of the first conductive layer is smaller than that of the second conductive layer.

It is preferable that the step of forming the first conductive layer includes to form the first conductive layer by means of a first film forming method and the step of forming the second conductive layer includes to form the second conductive layer by means of a second film forming method different from the first film forming method.

It is preferable that the first film forming method is a chemical vapor deposition method and the second film forming method is a sputtering method.

The foregoing and other objects, features, aspects and advantages of the present invention will become more apparent from the following detailed description/of the present invention when taken in conjunction with the accompanying drawings.

DESCRIPTION OF THE PREFERRED EMBODIMENTS

Description will be given of embodiments of the present invention below with reference to the accompanying drawings:

First Embodiment

Figure 1:
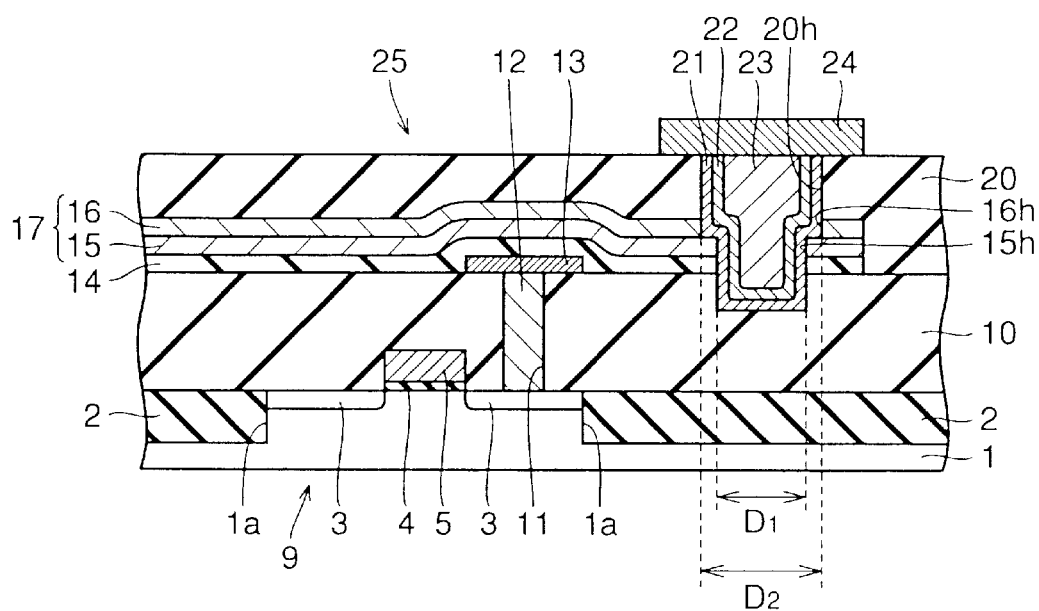
FIG. 1 is a sectional view of a semiconductor device according a first embodiment of the present invention.

Referring to FIG. 1, a DRAM as a semiconductor device according to the first embodiment of the present invention includes: a silicon substrate 1 as a semiconductor substrate; a titanium nitride film 15 as a first conductive layer formed on the silicon substrate 1; a titanium nitride film 16 as a second conductive layer on the titanium nitride film 15 in contact therewith; and an interlayer insulating film 20 as an insulating layer covering the titanium nitride film 16. A first opening 15h is formed in the titanium nitride film 15. Formed in the titanium nitride film 16 is an opening 16h as a second opening communicating with the opening 15h and having a diameter different from that of the opening 15h. Formed in the interlayer insulating film 20 is a contact hole 20h as a connection hole communicating with the opening 16h. The semiconductor device further includes: a titanium film 21, a titanium nitride film 22, a plug layer 23 and an interconnect layer 24 as a third conductive layer formed on an interlayer insulating film 10 so as to be electrically connected to the titanium nitride films 15 and 16 through the openings 15h and 16h.

The DRAM is constructed of a field effect transistor 9; and a capacitor 25 connected to the field effect transistor 9.

The field effect transistor 9 is constructed of a gate electrode 5 formed on the silicon substrate 1 with a gate oxide film 4 interposing therebetween; and a region 3 including a pair of source and drain formed on both sides of the gate electrode and spaced apart from each other on the silicon substrate 1. A gate length of the gate electrode 5 is 0.15 μm or less. Trenches 1a are formed on both sides of the field effect transistor 9 and a silicon oxide film 2 as an isolation insulating film is formed so as to fill the trenches 1a.

An interlayer insulating film 10 made of a silicon oxide film is formed on a surface of the silicon substrate 1. The interlayer insulating film 10 is formed by stacking a silicon oxide film produced from TEOS (Tetraethyl Orthosilicate) doped with boron and phosphorous as a starting material and a silicon oxide film produced from TEOS as a starting material. A contact hole 11 extending to the source/drain region 3 is formed in the interlayer insulating film 10. A plug layer 12 made of doped polysilicon is formed so as to fill the contact hole 11.

A capacitor 25 is formed on the interlayer insulating film 10. The capacitor 25 is constructed of: a storage node 13 as a first capacitor electrode electrically connected to the plug layer 12; a dielectric film 14 made of a tantalum oxide film formed on the storage node 13; and a cell plate 17 as a second capacitor electrode formed on the dielectric film 14.

The cell plate 17 includes the titanium nitride film 15 formed by means of a chemical vapor deposition (CVD) method and the titanium nitride film 16 formed by means of a sputtering method. The titanium nitride film 15 has the opening 15h and the titanium nitride film 16 has the opening 16h. A diameter $D_1$ of the opening 15h is about 0.18 μm and a diameter $D_2$ of the opening 16h is about 0.24 μm. A diameter of the opening 16h and a diameter of the contact hole 20h are almost equal. The present invention is especially effective when the diameter of the contact hole 20h is 0.24 μm or less.

The interlayer insulating film 20 made of a silicon oxide film is formed so as to cover the cell plate 17 of the capacitor 25. The contact hole 20h is formed in the interlayer insulating film 20. The titanium film 21 and the titanium nitride film 22 as a barrier layer are formed so as to fill the contact hole 20h and the openings 16h and 15h. The plug layer 23 made of tungsten is further formed so as to be in contact with the titanium nitride film 22 and fill the contact hole 20h. The interconnect layer 24 made of aluminum is formed on the interlayer insulating film 20 so as to be in contact with the plug layer 23.

Since a diameter of the opening 16h is larger than that of the opening 15h, a step arises between the openings 15h and 16h. The titanium film 21 and the titanium nitride film 22 are formed so as to conform with a surface configuration of this step.

Figure 2:
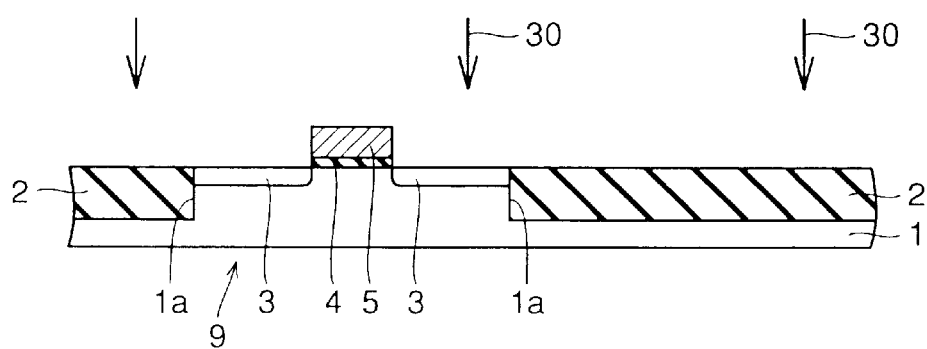
FIGS. 2 to 5 are sectional views representing a first to a fourth steps of a fabrication process for the semiconductor device shown in FIG. 1.

Then, description will be given of a fabrication process of the semiconductor device shown in FIG. 1. First of all, referring to FIG. 2, a resist pattern is formed on the surface of the silicon substrate 1 and the substrate 1 is etched according to the pattern. Thereby, the trenches 1a are formed. The silicon oxide film 2 is formed so as to fill the trenches 1a. A silicon oxide film and a polysilicon film are formed on the surface of the silicon substrate 1. A resist pattern is formed on the silicon oxide film and the polysilicon film and the silicon oxide film and the polysilicon film are etched according to the resist pattern. With this procedure, the gate oxide film 4 and the gate electrode 5 are formed. Ion implantation of an impurity such as phosphorous or arsenic is performed into the silicon substrate 1 in a direction shown by an arrow mark 30 with the gate electrode 5 as a mask. By doing so, a source and drain of the region 3 are formed on both sides of the gate electrode 5.

Figure 3:
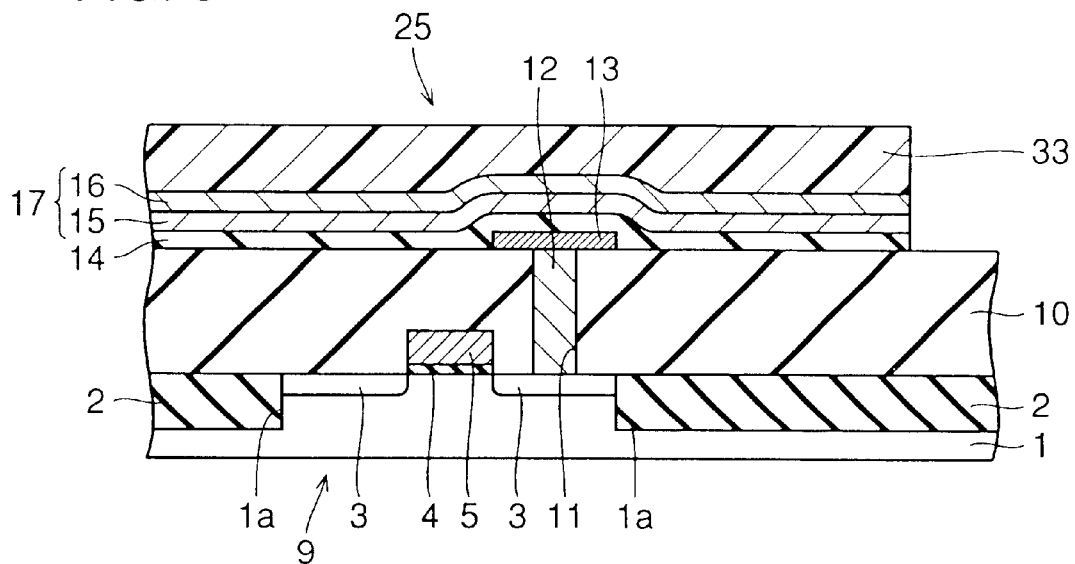

Referring to FIG. 3, the interlayer insulating film 10 is formed so as to cover the silicon substrate 1. A thickness of the interlayer insulating film 10 is 1800 nm or more. A resist pattern is formed on the interlayer insulating film 10 and the interlayer insulating film 10 is etched according to the resist pattern. By this etching, the contact hole 11 extending to the source/drain region 3 is formed. The plug layer 12 made of polysilicon is formed so as to fill the contact hole 11. A titanium nitride film is deposited on the interlayer insulating film 10 so as to be in contact with the plug layer 12 by means of a CVD method. A resist pattern with a prescribed pattern is formed on the titanium nitride film and the titanium nitride film is etched according to the resist pattern. Thus, the storage node 13 is formed. A tantalum oxide film is formed on the interlayer insulating film 10. The titanium nitride film 15 of 20 to 500 nm in thickness is formed on the tantalum oxide film by means of CVD. The titanium nitride film 16 of 20 to 80 nm in thickness is formed on the titanium nitride film 15 by means of a sputtering method. A resist pattern 33 with a prescribed pattern is formed on the titanium nitride film 16. The titanium nitride film formed by the sputtering method, the titanium nitride formed by the CVD method and the tantalum oxide film are etched with the resist pattern 33 as a mask. The dielectric film 14, and the titanium nitride films 15 and 16 are formed by this etching. The titanium nitride films 15 and 16 constitutes the cell plate 17.

Figure 4:
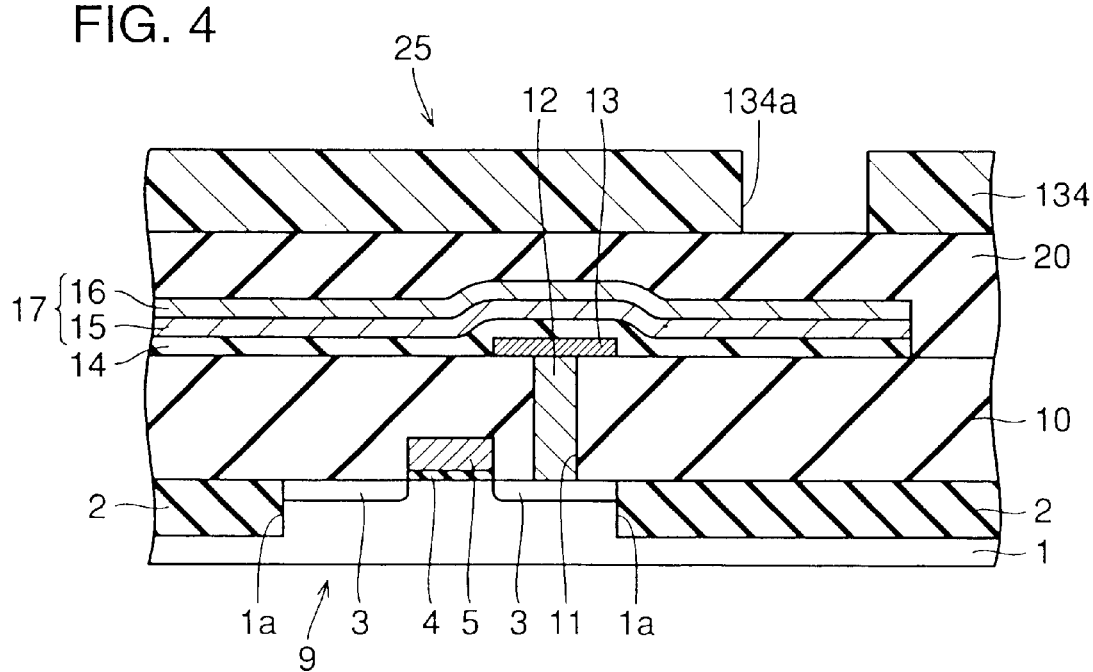

Referring to FIG. 4, the interlayer film 20 is formed so as to cover the cell plate 17. A resist pattern 134 as a mask layer having a hole 134a is formed on the interlayer insulating film 20.

Figure 5:
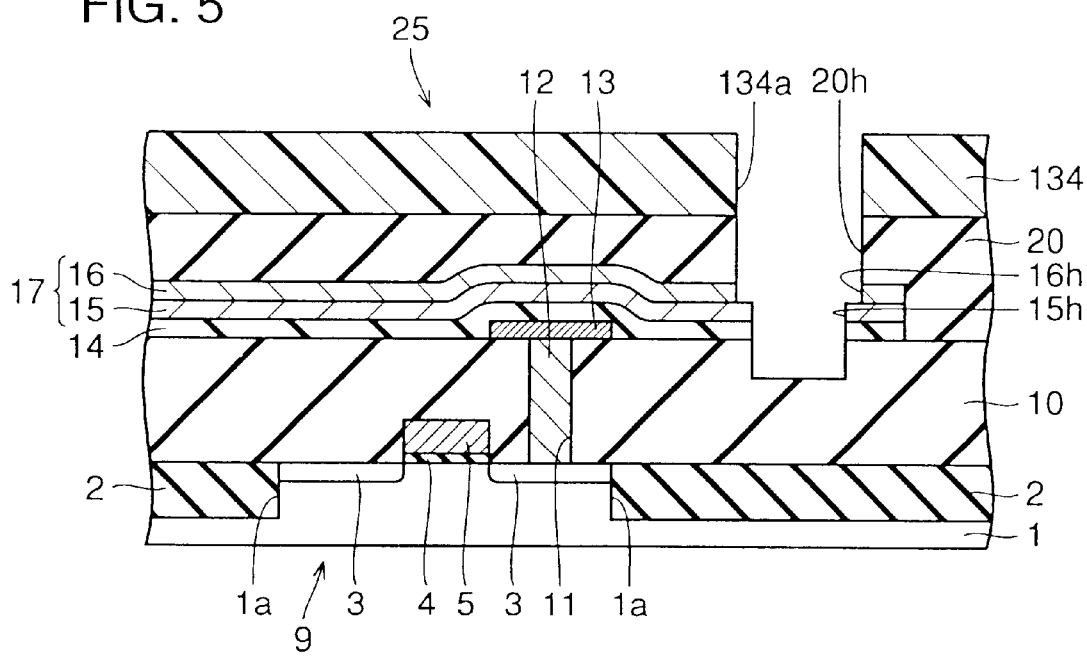

Referring to FIG. 5, the interlayer insulating film 20, the titanium nitride films 15 and 16, the dielectric film 14 and the interlayer insulating film 10 are etched with the resist pattern 134 as a mask layer. At this time, a mixed gas of $C_5F_8$ gas, $O_2$ gas and Ar gas is used as an etchant. With this mixed gas adopted, an etching rate of the titanium nitride film 15 as a first conductive layer is less than that of the titanium nitride film 16 as a second conductive layer. Thereby, the contact hole 20h and the openings 16a and 15h are formed.

Referring to FIG. 1, a titanium film is formed so as to cover sidewalls of the contact hole 21 and the openings 16h and 15h. A titanium nitride film is formed on the titanium film. A tungsten film is formed on the titanium nitride film. Thus formed films lying outside of the contact hole 20h are all etched back. Formed by this etching back are the titanium film 21 in contact with the side walls of the contact hole 21 and the openings 16h and 15h, the titanium nitride film 22 in contact with the titanium film 21 and the plug layer 23 in contact with the titanium nitride film 22. An aluminum film is formed on the interlayer 20 so as to be in contact with the plug layer 23. A resist pattern is formed on the aluminum film and the aluminum film is etched according to the resist pattern. By etching the aluminum film, the interconnect layer 24 is formed to complete the semiconductor device shown in FIG. 1.

In the semiconductor device and the capacitor structure as described above, as shown in FIG. 1, a step arises between the openings 16h and 15h. Since the titanium film 21 is formed so as to conform to a surface configuration of the step, combined contact areas of the titanium film 21 with the titanium nitride films 15 and 16 as the first and second conductive layers, respectively, become larger. As a result, contact resistance between the titanium film 21 and both of the titanium nitride films 15 and 16 can be reduced, which makes it easier to keep a potential of the cell plate 17 at a prescribed value, with the result that there can be provided not only a high reliability semiconductor device but also a high reliability capacitor.

Second Embodiment

Figure 6:
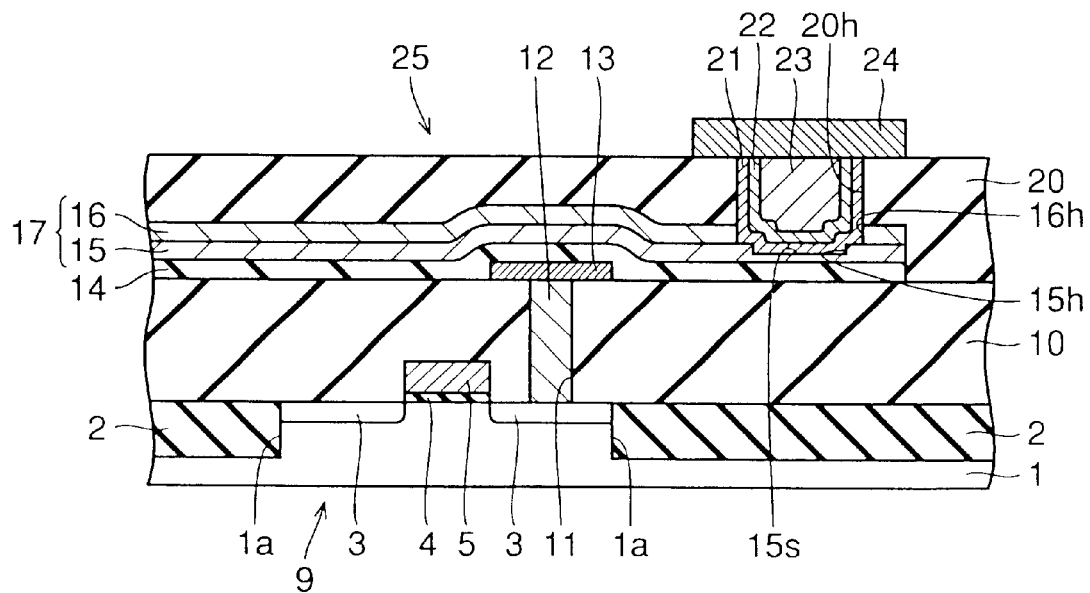
FIG. 6 is a sectional view of a semiconductor device according to a second embodiment of the present invention.

Referring to FIG. 6, a semiconductor device according to the second embodiment is different from that according to the first embodiment in that in the second embodiment, a titanium nitride film 15 as a first conductive layer has a bottom surface 15s. That is, in the second embodiment, while a opening 15h is formed in the titanium nitride film 15, the opening 15h does not pass through the titanium nitride film 15. A titanium film 21 is formed so as to be in contact with the bottom surface 15s. For this reason, in the second embodiment, a contact area of a titanium film 21 with the titanium nitride film 15 is larger compared with the first embodiment.

The semiconductor device and the capacitor structure thus constructed, first of all, have an effect similar to that of the semiconductor device and the capacitor structure according to the first embodiment. Furthermore, since the titanium nitride film 15 and the titanium film 21 are also in contact with each other at the bottom surface 15s, a contact area between the titanium nitride film 15 and the titanium film 21 can be further increased. As a result, there arises an effect of obtaining more reduce contact resistance.

Note that as a fabrication process for a semiconductor device shown in FIG. 6, a process is adopted in which a thickness of the titanium nitride film 15 deposited by means of a CVD method and hard to be etched off is formed so as to be larger than in the first embodiment. Furthermore, another process is adopted in which, in a step of forming a contact hole 20h and openings 16h and 15h, etching is performed in a condition that an etching rate of the titanium nitride film 15 is slower than that of a titanium nitride film 16.

Third Embodiment

Figure 7:
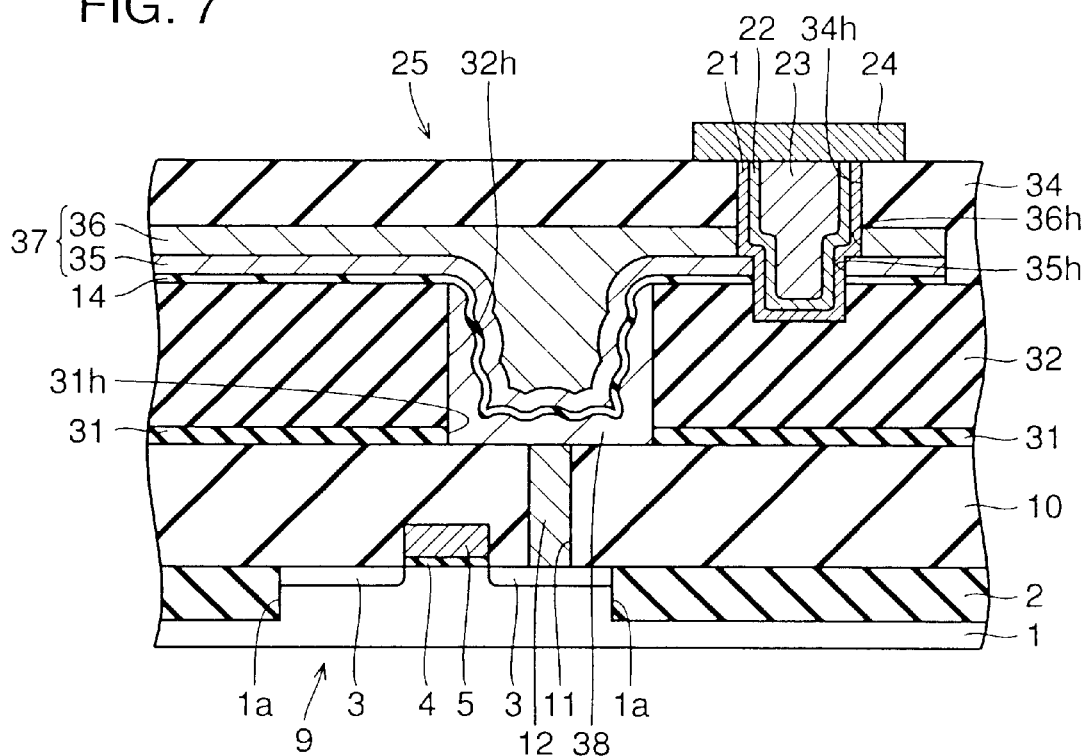
FIG. 7 is a sectional view of a semiconductor device according to a third embodiment of the present invention.

Referring to FIG. 7, a semiconductor device according to the third embodiment is different from that according to the first embodiment in that in the semiconductor device according to the third embodiment, a structure of a cell plate 37 is different from that of the first embodiment. That is, while in the first embodiment, the cell plate 17 is of the shape of a flat plate, in the third embodiment the cell plate 37 includes a portion of the shape of a flat plate and a portion filling a hole 32h. That is, in the third embodiment, a field effect transistor 9 is formed in a way similar to in the first embodiment. An interlayer insulating film 10 is formed so as to cover the field effect transistor 9. A silicon nitride film 31 is formed on the interlayer insulating film 10 as an etching stopper. Formed in the silicon nitride film 31 is an opening 31h so as to expose part of the interlayer insulating film 10 and a plug layer 12.

An interlayer insulating film 32 made of a silicon oxide film is formed so as to cover the silicon nitride film 31. The hole 32h communicating with the opening 31h is formed in the interlayer insulating film 32. A storage node 38 as a first capacitor electrode is formed on a bottom surface and sidewall of the hole 32h. The storage node 38 is formed so as to be in contact with the sidewalls of the hole 32h and the opening 31h, a surface of the interlayer insulating film 10 and the plug layer 12. Protrusion and recesses are formed on a surface of the storage node 38, whereby a surface area of the storage node 38 is increased.

A dielectric film 14 is formed so as to be in contact with the interlayer insulating film 32 and the storage node 38. The dielectric film 14 is formed so as to be in conformity with a surface configuration including protrusions and recesses of the storage node 38. The cell plate 37 as a second capacitor electrode is formed on the dielectric film 14. The cell plate 37 is composed of a titanium nitride film 35 in contact with the dielectric film 14 and a titanium nitride film 36 in contact with the titanium nitride film 35. The titanium nitride film 35 is deposited by means of a CVD method and the titanium nitride film 36 is deposited by a sputtering method. Openings 35h and 36h are formed in the titanium nitride films 35 and 36.

An interlayer insulating film 34 made of a silicon oxide film is formed so as to cover the cell plate 37. The interlayer film 34 is produced using TEOS as a starting material. A contact hole 34h is formed in the interlayer insulating film 34. The contact hole 34h communicates with the opening 36h. That is, an opening 35h as a first opening is formed in the titanium nitride layer 35 as a first conductive layer. The opening 36h as a second opening communicating with the opening 35h, and having a diameter different from that of the opening 35h is formed in the titanium nitride film 36 as a second conductive layer. A contact hole 34h as a connection hole communicating with the opening 36h is formed in the interlayer insulating film 34 as an insulating layer. Formed on the interlayer insulating film 34 are a titanium film 21, a titanium nitride film 22, a plug layer 23 and an interconnect layer 24 as a third conductive layer so as to be electrically connected to the titanium nitride films 35 and 36 through the openings 35h and 36h.

Figure 8:
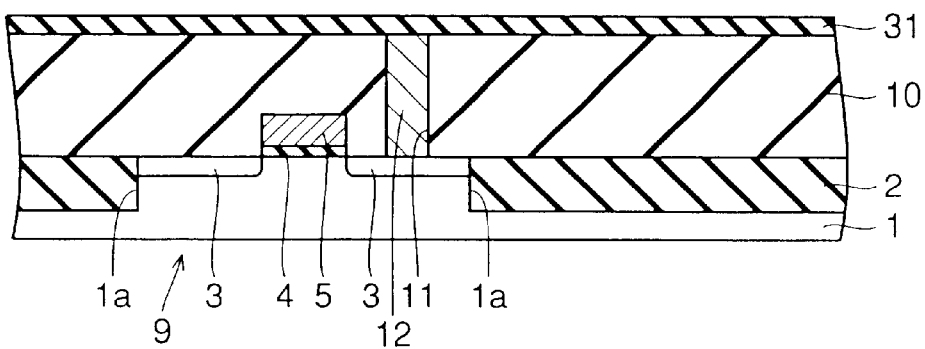
FIGS. 8 to 14 are sectional views representing a first to a seventh steps of a fabrication process for the semiconductor device shown in FIG. 7.

Referring to FIG. 8, trenches 1a are formed on a surface of the silicon substrate 1 in a way similar to in the first embodiment and a silicon oxide film 2 fills the trenches 1a. A gate oxide film 4 and a gate electrode 5 are formed on the surface of the silicon substrate 1. A source/drain region 3 is formed on the silicon substrate 1 by ion implantation of an impurity into the silicon substrate 1 with the gate electrode 5 as a mask. The interlayer insulating film 10 is formed so as to cover the silicon substrate 1. A contact hole 11 is formed in the interlayer insulating film 10 and a plug layer 12 is formed so as to fill the contact hole 11. The silicon nitride film 31 is formed by means of a CVD method so as to cover the surface of the interlayer insulating film 10.

Figure 9:
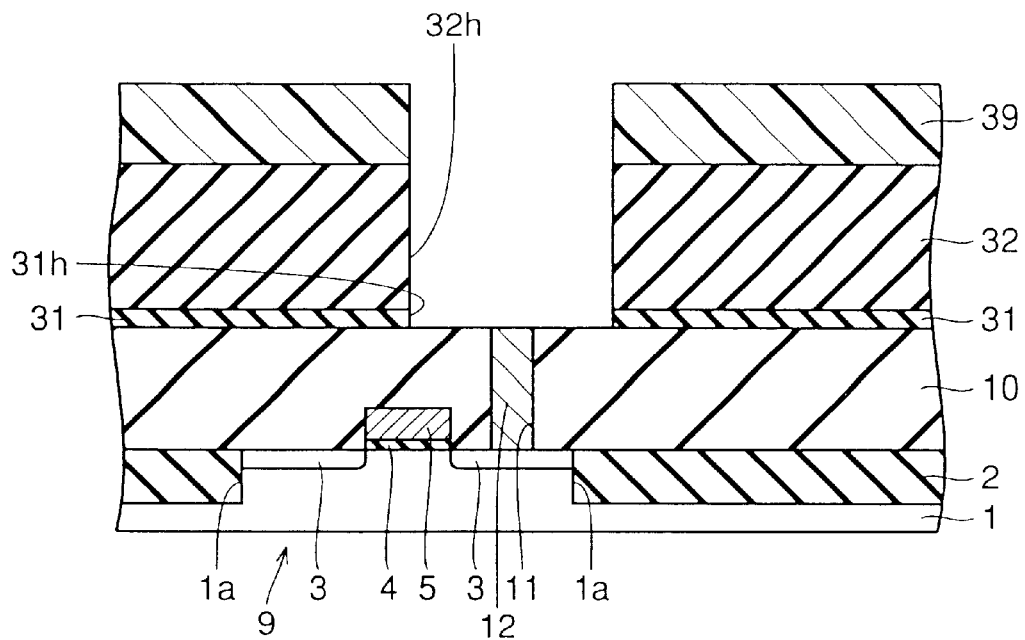

Referring to FIG. 9, the interlayer insulating film 32 made of a silicon oxide film is formed on the silicon nitride film 31. A resist pattern 39 is formed on the interlayer insulating film 32 and the interlayer insulating film 32 is etched according to the resist pattern 39. By doing so, the hole 32h is formed. Then, the etchant is altered and the silicon nitride film 31 is etched using a different etchant by which the silicon nitride 31 is etched with ease. Thereby, the opening 31h is formed. By the etching, surfaces of the interlayer insulating film 10 and the plug layer 12 are exposed.

Figure 10:
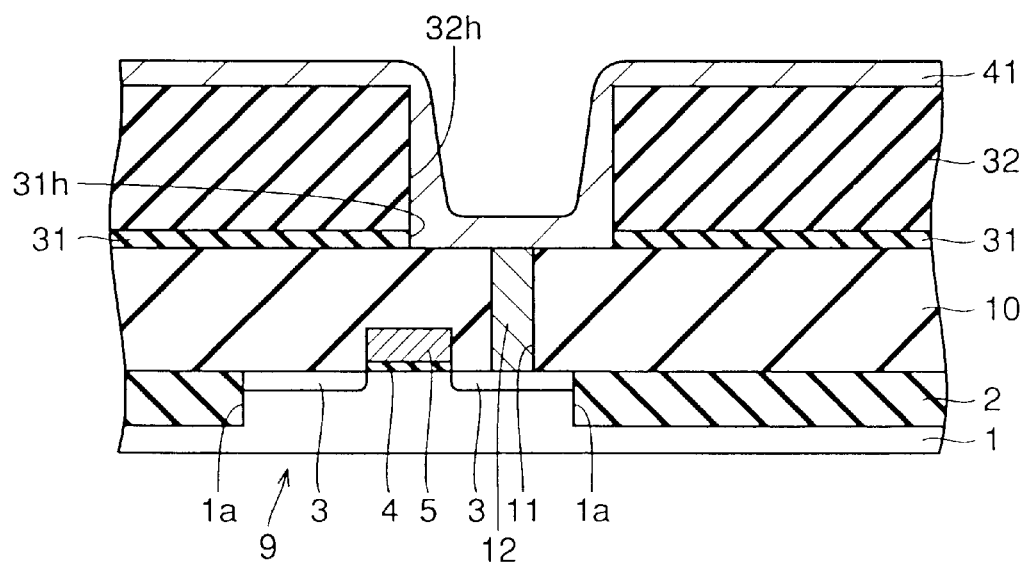

Referring to FIG. 10, an amorphous silicon film 41 is formed by a CVD method so as to be in contact with a surface of the interlayer insulating film 32, a surface of the hole 32h, a surface of the opening 31h, the surface of the interlayer insulating film 10 and the surface of the plug layer 12.

Figure 11:
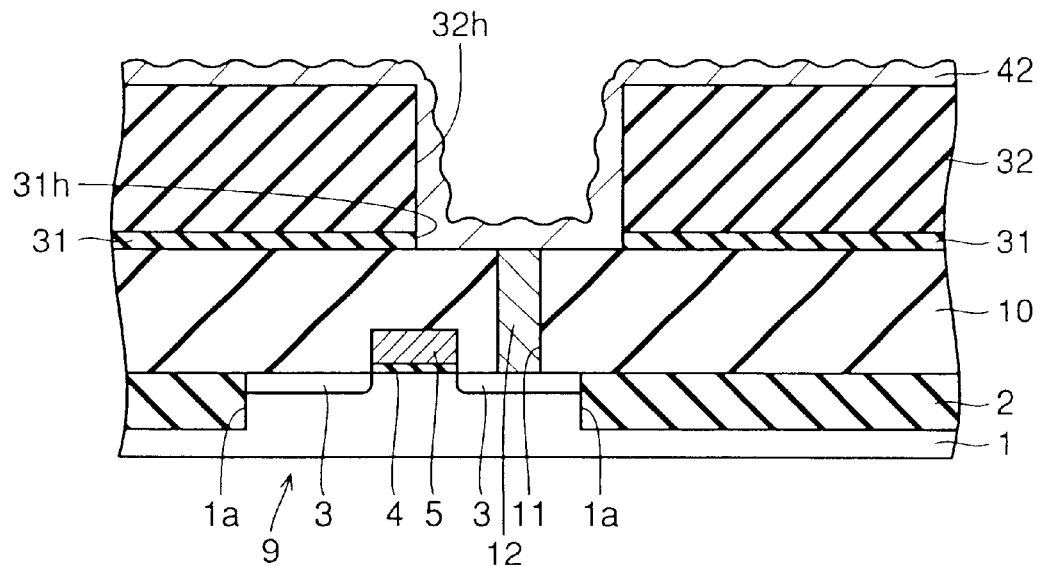

Referring to FIG. 11, the amorphous silicon film is crystallized to form a polycrystalline silicon film 42. At this time, a surface of the polycrystalline silicon film is roughened.

Figure 12:
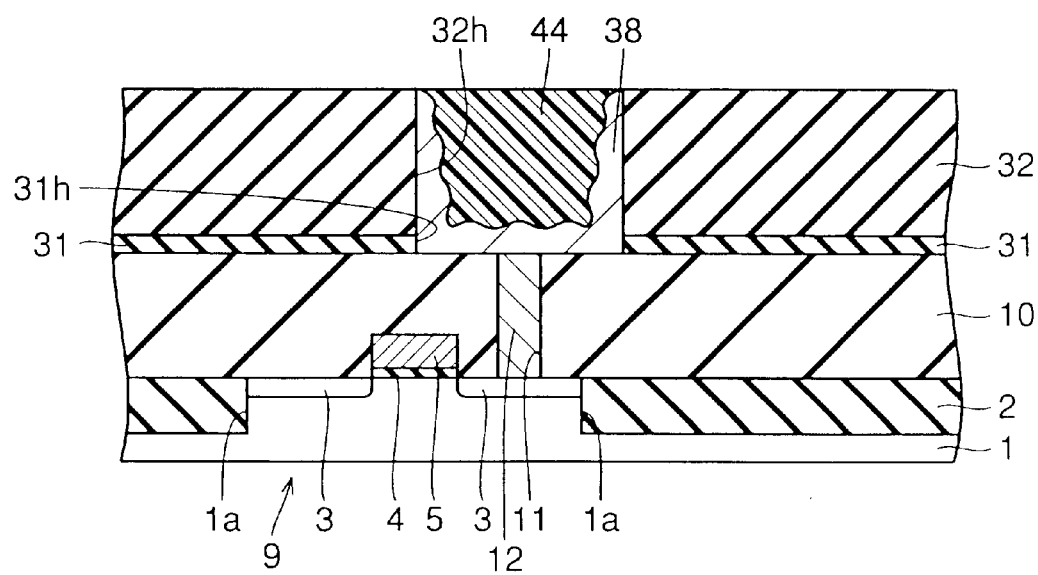

Referring to FIG. 12, a resist pattern 44 is formed so as to fill the hole 32h. The polycrystalline silicon film 42 other than to fill the hole 32h is removed with the resist pattern 44 as a mask. By doing so, the storage node 38 is formed in the hole 32h.

Figure 13:
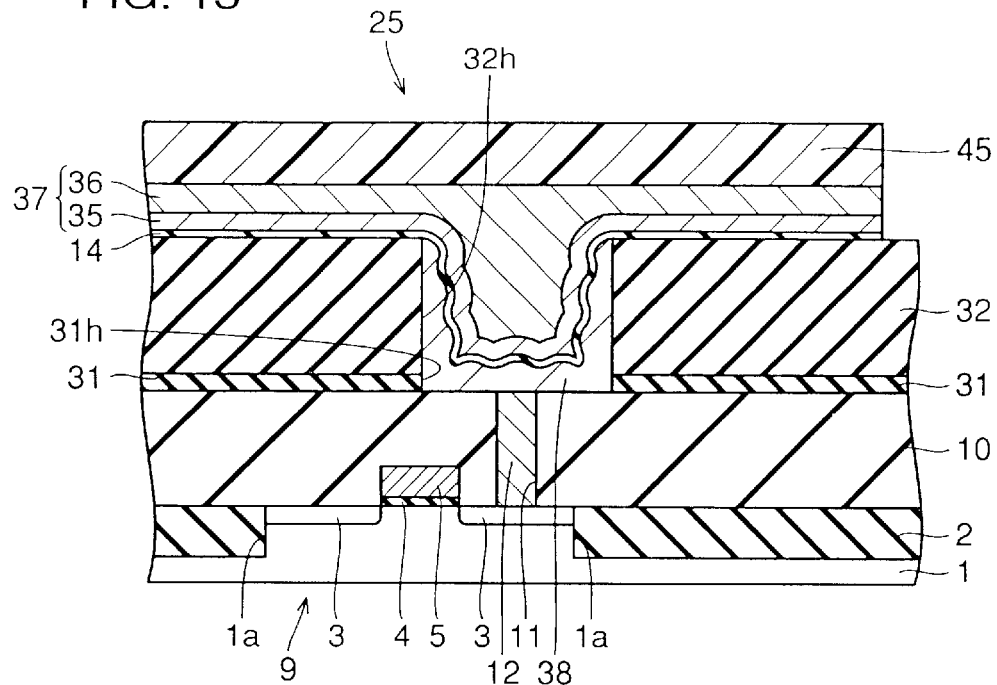

Referring to FIG. 13, a tantalum oxide film is formed so as to be in contact with the interlayer insulating film 32 and the storage node 38. A titanium nitride film is formed on the tantalum oxide film by means of a CVD method. A titanium nitride film is formed on the titanium nitride film by a sputtering method. A resist pattern 45 is formed on the titanium nitride film. The titanium nitride films and the tantalum oxide film are etched with the resist pattern 45 as a mask to form the cell plate 37 and the dielectric film 14. The cell plate 37 is composed of the titanium nitride film 35 deposited by means of a CVD method as first film forming means and the titanium nitride film 36 deposited by means of a sputtering method as second film forming means different from the first film forming means.

Figure 14:
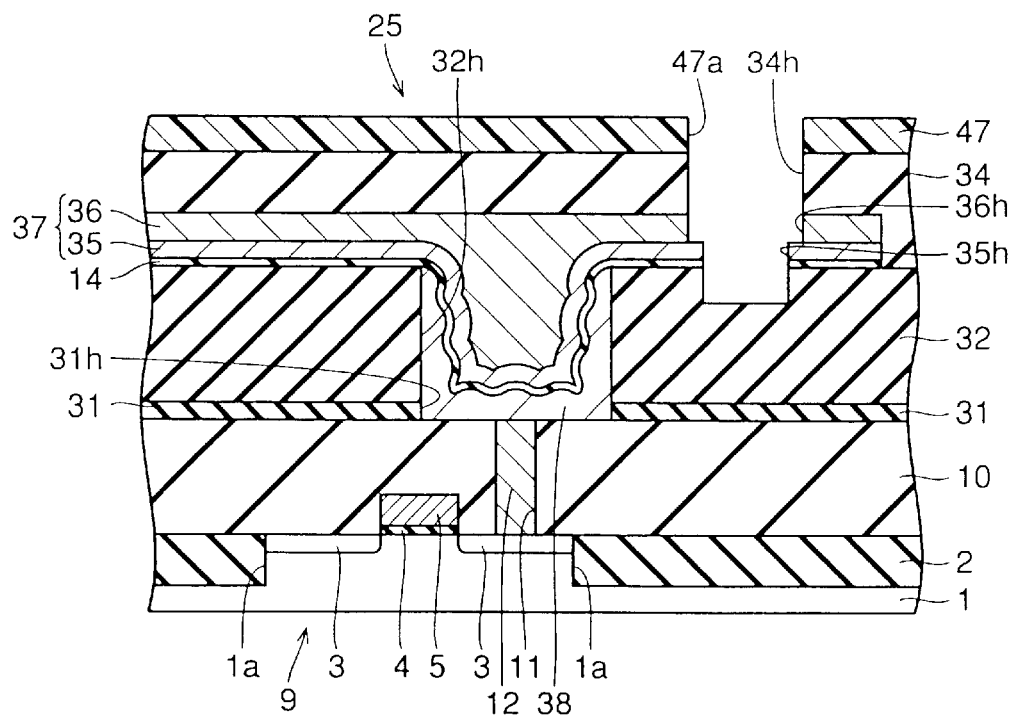

Referring to FIG. 14, the interlayer insulating film 34 is formed so as to cover the cell plate 37. A resist pattern 47 having a hole 47a as a mask layer is formed on the interlayer insulating film 34. Etching is performed on the interlayer insulating film 34, the titanium nitride films 36 and 35, the dielectric film 14, and the interlayer insulating film 32 using an etchant similar to that used in the first embodiment with the resist pattern 47 as a mask. Thereby, the contact hole 34h and the openings 36h and 35h are formed.

Referring finally to FIG. 7, a titanium film 21, a titanium nitride film 22, a plug layer 23 and an interconnect layer 24 are formed by means of a method similar to that in the first embodiment. Thus, the semiconductor device shown in FIG. 7 is completed.

In a semiconductor device and a capacitor structure as described above, there is obtained an effect similar to that of the semiconductor device shown in the first embodiment. Furthermore, since the surface of the storage node 38 is roughened to increase a surface area thereof, opposed surfaces of the storage node 38 and the cell plate 37, respectively, become larger in effective area, thereby enabling a capacitance of a capacitor to increase.

Fourth Embodiment

Figure 15:
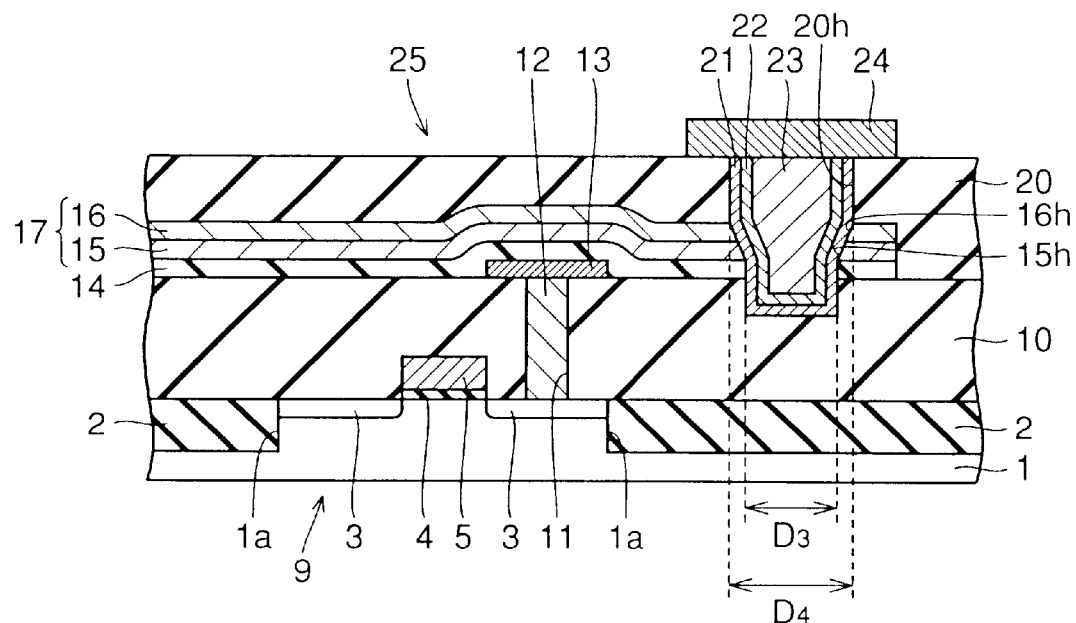
FIG. 15 is a sectional view of a semiconductor device according to a fourth embodiment of the present invention.
Figure 16:
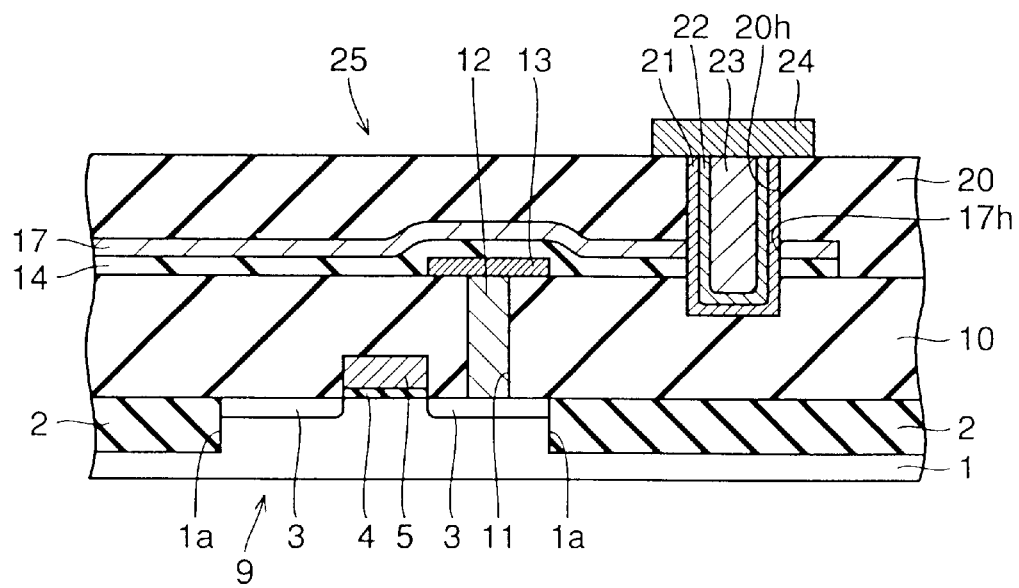
FIG. 16 is a sectional view of a prior art DRAM.

Referring to FIG. 15, a semiconductor device according to the fourth embodiment of the present invention is different from the semiconductor device shown in the first embodiment in that in the fourth embodiment, combined openings 16h and 15h have a tapered profile in section. A diameter $D_4$ of the opening 16h is about 0.24 μm and a diameter $D_3$ of the opening 15h is about 0.18 μm. In order to produce such openings 16h and 15h, it is only required that an etchant having a trend of forming a tapered opening is selected.

With such a semiconductor device as well, there arises an effect similar to that of the semiconductor device shown in FIG. 1.

Description has been given of the embodiments of the present invention and the embodiments can be modified or altered in various ways. As materials constituting a cell plate 17, there have been shown a titanium nitride film 15 or 35 produced by means of a CVD method and a titanium nitride film 16 or 36 produced by means of a sputtering method, in which there is no specific limitation to those films, but for example, a first conductive layer and a second conductive layer may be formed respective materials different from each other. That is, when a first conductive layer is of tungsten, a second layer can be of titanium. Furthermore, when a first conductive layer is of copper, a second layer can be of titanium. In other words, a first conductive layer can be made of one selected from the group consisting of tungsten, titanium, copper, aluminum and others and a conductive layer can be a different one from the first conductive layer selected from the same group.

First and second conductive layers both may include polysilicon as a first element and an impurity such as phosphorous, arsenic or boron as a second element. In this case, a ratio of polysilicon to an impurity in the first conductive layer is required to be different from a ratio of polysilicon to an impurity in the second conductive layer.

According to the present invention, a high reliability semiconductor device and a high reliability capacitor structure can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate;

a first conductive layer formed on said semiconductor substrate;

a second conductive layer on said first conductive layer in contact therewith; and an insulating layer covering said second conductive layer, wherein a first opening is formed in said first conductive layer, a second opening communicating with said first opening and having a diameter different from that of said first opening is formed in said second conductive layer, a connection hole communicating with said second opening is formed in said insulating layer, and further comprising:

a third conductive layer formed on said insulating layer so as to be electrically connected to said first and second conductive layers through said first and second openings.

2. The semiconductor device according to claim 1, wherein a diameter of said second opening is larger than that of said first opening.

3. The semiconductor device according to claim 1, wherein said first opening has a bottom surface.

4. The semiconductor device according to claim 1, wherein said third conductive layer includes a plug layer filling said connection hole and electrically connected to said first and second conductive layers.

5. The semiconductor device according to claim 1, wherein said first and second conductive layers are made of respective materials different from each other.

6. The semiconductor device according to claim 1, wherein said first and second conductive layers are formed by means of respective methods different from each other.

7. The semiconductor device according to claim 6, wherein said first conductive layer is a titanium nitride film formed by means of a chemical vapor deposition method and said second conductive layer is a titanium nitride formed by means of a sputtering method.

8. The semiconductor device according to claim 1, wherein said first and second conductive layers each include first and second elements and a ratio of said first element to said second element in said first conductive layer is different from a ratio of said first element to said second element in said second conductive layer.

9. The semiconductor device according to claim 1, wherein said first conductive layer constitutes a cell plate of a capacitor of a dynamic random access memory.

10. A capacitor structure comprising:

a first capacitor electrode;

a dielectric film formed on said first capacitor electrode; and a second capacitor electrode formed on said dielectric film, said second capacitor electrode including:
- a first conductive layer; and
- a second conductive layer on said first conductive layer in contact therewith, further comprising: an insulating layer covering said second conductive layer, wherein a first opening is formed in said first conductive layer, a second opening communicating with said first opening and having a diameter different from that of said first opening is formed in said second conductive layer and a connection hole communicating with said second opening is formed in said insulating layer, and still further comprising: a third conductive layer formed on said insulating layer so as to be electrically connected to said first and second conductive layers through said first and second openings.

* * * * *